US 11,398,390 B2

(12) United States Patent
Ahn et al.

(10) Patent No.: US 11,398,390 B2
(45) Date of Patent: Jul. 26, 2022

(54) PENDULUM VALVE

(71) Applicant: FUGEN CO., LTD., Yongin-si (KR)

(72) Inventors: Hee Jun Ahn, Pyeongtaek-si (KR); Joo taek Kim, Suwon-si (KR)

(73) Assignee: FUGEN CO., LTD., Yongin-si (KR)

( * ) Notice: Subject to any disclaimer, the term of this patent is extended or adjusted under 35 U.S.C. 154(b) by 0 days.

(21) Appl. No.: 17/316,818

(22) Filed: May 11, 2021

(65) Prior Publication Data

US 2021/0358771 A1 Nov. 18, 2021

(30) Foreign Application Priority Data

May 12, 2020 (KR) .................. 10-2020-0056301

(51) Int. Cl.
*F16K 51/02* (2006.01)
*F16K 31/53* (2006.01)
*F16K 3/02* (2006.01)
*H01L 21/67* (2006.01)
*F16K 3/10* (2006.01)
*F16K 31/04* (2006.01)

(52) U.S. Cl.
CPC ...... *H01L 21/67017* (2013.01); *F16K 3/0254* (2013.01); *F16K 3/10* (2013.01); *F16K 31/047* (2013.01)

(58) Field of Classification Search
CPC .... F16K 31/047; F16K 31/041; F16K 31/535; F16K 3/0254; F16K 3/10; F16K 3/314; F16K 3/04; F16K 51/02; H01L 21/67017; H01L 21/67069
See application file for complete search history.

(56) References Cited

U.S. PATENT DOCUMENTS

| 4,556,196 A | * | 12/1985 | Nimberger | ........... F16J 15/3208 |
| | | | | 251/223 |
| 7,004,453 B1 | * | 2/2006 | Cheng | ....................... F16K 3/10 |
| | | | | 251/211 |
| 2018/0195557 A1 | * | 7/2018 | Dichter | ............... F16C 33/7816 |

(Continued)

FOREIGN PATENT DOCUMENTS

| CN | 108331930 | * | 7/2018 |
| CN | 108343779 | * | 7/2018 |
| JP | 2004-205005 A | | 7/2004 |

(Continued)

*Primary Examiner* — Marina A Tietjen
(74) *Attorney, Agent, or Firm* — KORUS Patent, LLC; Seong Il Jeong

(57) ABSTRACT

The present invention relates generally to a pendulum valve that is installed in a connection pipe connecting a vacuum pump between the chamber of a dry etching apparatus and the vacuum pump in the etching line of a semiconductor manufacturing process and adjusts the amount of gas, and more particularly to a pendulum valve that includes a fixed housing configured such that a shaft coupled to a valve gate for adjusting the amount of gas is closely fixed to a valve housing through an O-ring and a rotation shaft (an internal shaft) coupled to the inside of the fixed housing, so that only the rotation shaft separate from the value housing is rotated by using a lip seal as a rotation axis, thereby suppressing the discharge of unnecessary particles and hardened substances while maintaining the sealing characteristics of the pendulum valve.

3 Claims, 8 Drawing Sheets

(56) References Cited

U.S. PATENT DOCUMENTS

2018/0195639 A1\* 7/2018 Kogame ................. F16K 51/02
2020/0116109 A1\* 4/2020 Miura ................... F16K 31/047

FOREIGN PATENT DOCUMENTS

| JP | 2011-137537 A | 7/2011 |
| KR | 10-2003-0017204 A | 3/2003 |
| KR | 10-2006-0013810 A | 2/2006 |
| KR | 10-2012-0132100 A | 12/2012 |
| KR | 20-2019-0002255 U | 9/2019 |

\* cited by examiner

PENDULUM VALVE

CROSS-REFERENCE TO RELATED APPLICATION

This application claims the benefit of Korean Patent Application No. 10-2020-0056301 filed on May 12, 2020, which is hereby incorporated by reference herein in its entirety.

BACKGROUND

1. Technical Field

The present invention relates generally to a pendulum valve that is installed in a connection pipe connecting a vacuum pump between the chamber of a dry etching apparatus and the vacuum pump in the etching line of a semiconductor manufacturing process and adjusts the amount of gas, and more particularly to a pendulum valve that includes a fixed housing configured such that a shaft coupled to a valve gate for adjusting the amount of gas is closely fixed to a valve housing through an O-ring and a rotation shaft (an internal shaft) coupled to the inside of the fixed housing, so that only the rotation shaft separate from the value housing is rotated by using a lip seal as a rotation axis, thereby suppressing the discharge of unnecessary particles and hardened substances while maintaining the sealing characteristics of the pendulum valve.

2. Description of the Related Art

In general, in a semiconductor manufacturing process, an etching apparatus has a structure in which a chamber configured such that an etching process is performed therein and a vacuum pump configured to apply vacuum to the chamber or discharge residual gas from the chamber to the outside are connected to each other. Usually, a pendulum valve is installed in a connection pipe that connects the chamber and the vacuum pump.

The pendulum valve includes a valve housing having an inlet and an outlet, and a valve gate located in the inner space of the valve housing and connected to a support arm firmly connected to a shaft. The shaft is rotatable around its longitudinal axis and is movable in upward and downward axial directions.

FIG. 1 is a plan view showing a conventional pendulum valve, and FIG. 2 is a sectional view of the conventional pendulum valve. In this case, FIG. 2 is a sectional view taken along line I-II shown in FIG. 1.

Referring to FIGS. 1 and 2, a conventional pendulum valve 50 is generally installed in the connection pipe 40 connecting a vacuum pump between the chamber of a dry etching apparatus and the vacuum pump and selectively performs opening and closing. The conventional pendulum valve 50 basically includes a valve housing 10 installed in the connection pipe 40, a cover 20 fastened to the valve housing 10, and an opening/closing part 30 configured to selectively open and close the connection pipe 40.

The valve housing 10 is configured such that an air passage 37 vertically penetrates through the valve housing 10 in order to communicate with the chamber and the vacuum pump and an operation chamber 12 is formed horizontally inside the valve housing 10 in order to communicate with the air passage 37. In addition, the opening/closing part 30 includes a disc-shaped valve gate 31 and a driving part 33 configured to selectively open and close the connection pipe 40 by causing the valve gate 31 to perform pendulum movement. The driving part 33 includes a stepper motor 32, and a shaft 38 connected to one end of the shaft 34 of the stepper motor by means of a gear 36. In this case, one end of the valve gate 31 is connected to the other end of the shaft 38.

The stepper motor 32 is independently installed below the valve housing 10, and rotates the shaft 38 whose upper part protrudes into the operation chamber 12. Accordingly, after one end of the valve gate 31 has been connected to the upper portion of the shaft 38, the valve gate 31 selectively opens and closes the air passage 37 while being rotated. The sealing element 39 is installed in the upper portion of the operation chamber 12 to come into contact with the air passage 37, and is provided with sealing rings 39a and 39b so that the sealing element 39 is lowered and tightly seals the valve gate 31 by the operation of the air cylinder 25. The stepper motor 32 is operated by an electric signal, and the gear 36 serves to transmit the power of the stepper motor 32 to the shaft 38.

The operating characteristics of the conventional pendulum valve 50 having the above configuration will now be described.

FIGS. 3 and 4 are sectional views illustrating the operating characteristics of the conventional pendulum valve. FIG. 3 shows a state in which the connection pipe is open, and FIG. 4 shows a state in which the connection pipe is closed.

First, a process of opening the connection pipe will be described with reference to FIG. 3.

As shown in FIG. 3, after the air passage 37 of the valve housing 10 has been installed between the chamber and the vacuum pump, the stepper motor 32 is controlled by transmitting a control signal to the stepper motor 32. In this case, the stepper motor 32 is intended for initial operation, and is rotated in response to a preset set value in software installed in equipment for manufacturing a semiconductor device.

The rotational force of the stepper motor 32 is transmitted to the shaft 38 through the gear 36. The shaft 38 is rotated by the rotational force of the stepper motor 32 transmitted through the gear 36, and the valve gate 31 is rotated using the shaft 38 as a rotation axis to open the air passage 37 formed in the valve housing 10, thereby allowing air to selectively enter and exit through the air passage 37. In this case, the sealing element 39 is moved upward by the air cylinder 25, and is spaced apart from the valve gate 31 by a predetermined interval.

A process of closing the connection pipe will be described with reference to FIG. 4.

As shown in FIG. 4, when the stepper motor 32 is rotated in the direction opposite to the direction rotated in FIG. 3 in response to an electric signal from the control unit installed in the pendulum valve 50, the rotational force rotates the shaft 38 via the gear 36. As the rotation in this case is rotated in a direction opposite to the rotating direction described above, the valve gate 31 is rotated in the opposite direction to seal the air passage 37 of the valve housing 10, and then the air cylinder 25 embedded in a predetermined position of the valve housing 10 is operated. Like the stepper motor 32, the air cylinder 25 is operated for a predetermined period in response to an electric signal value of software.

However, in the conventional pendulum valve 50, an O-ring 41 is installed between the shaft 38 and the valve housing 10. Due to the repetitive rotation of the shaft 38, the O-ring 41 is easily distorted by stress and the mechanical strength is weakened over time, resulting in a problem in that the sealing force is lowered. In particular, a problem arises in that particles such as fine sludge are generated due to the pulverization of the material attributable to frequent friction between the shaft 38 and the valve housing 10.

In order to prevent the above problem, when a lubricant such as a grease type lubricant is applied to the O-ring 41, plasma gas generated during an etching process easily reacts with the lubricant and is hardened. The material hardened as described above is pulverized again by the movement of the O-ring 41 to cause the generation of particles. In other words, the lubricant is hardened by rotational heat, contact with corrosive gas, and ambient heat and generates particles, and the generated particles adhere to a wafer and also affect rotation. Therefore, so there is a limitation to the solving of the above problems through the application of a lubricant.

RELATED ART DOCUMENTS

Patent Document 1: KR 10-2006-0013810 A published on Feb. 14, 2006
Patent Document 2: KR 10-2003-0017204 A published on Apr. 3, 2003
Patent Document 3: KR 20-2019-0002255 U published on Sep. 5, 2019

SUMMARY

The present invention has been conceived to overcome the above-described problems of the conventional technology, and an object of the present invention is to provide a pendulum valve that a shaft coupled to a valve gate for adjusting the amount of gas is constructed in a dual structure, and thus a fixed housing is tightly fixed to a valve housing through an O-ring and a rotating shaft (an internal shaft) coupled to the inner side of the fixed housing is installed rotatably through the medium of a lip seal, so that only the rotation shaft is rotated, thereby suppressing the discharge of unnecessary particles and hardened substances while maintaining the sealing characteristics of the pendulum valve.

In order to accomplish the above object, according to an aspect of the present invention, there is provided a pendulum valve for semiconductor device manufacturing equipment installed between a process chamber and a vacuum pump, the pendulum valve including: a valve housing configured such that an air passage penetrates therethrough in order to communicate with the chamber and the vacuum pump and an operation chamber is formed to communicate with the air passage; a valve gate installed inside the valve housing, and configured to selectively open and close the air passage through pendulum movement; a shaft connected to one end of the valve gate, and configured to rotate the valve gate; a motor configured to rotate the shaft; and a gearbox configured to transmit the driving force of the motor to the shaft; wherein the shaft includes: a fixed housing configured to penetrate and be fixedly coupled through the bottom of the valve housing; a lip seal provided inside the fixed housing; and a rotation shaft coupled to the inside of the lip seal to penetrate through the center of the lip seal such that one end thereof is coupled to the gearbox and the other end thereof is coupled to one end of the valve gate, and configured to be rotated by the driving force transmitted through the gearbox by using the lip seal as a rotation axis, thereby rotating the valve gate.

The shaft may further include first and second caps respectively coupled to both sides of the fixed housing so that the ends of the rotation shaft penetrate and are coupled through the first and second caps.

The shaft may further include bushings installed in the fixed housing on both sides of the lip seal so that the lip seal is not separated from the fixed housing.

An O-ring may be installed in a stepped portion of the fixed housing in close contact with the bottom of the valve housing for vacuum sealing.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION

Figure 1:
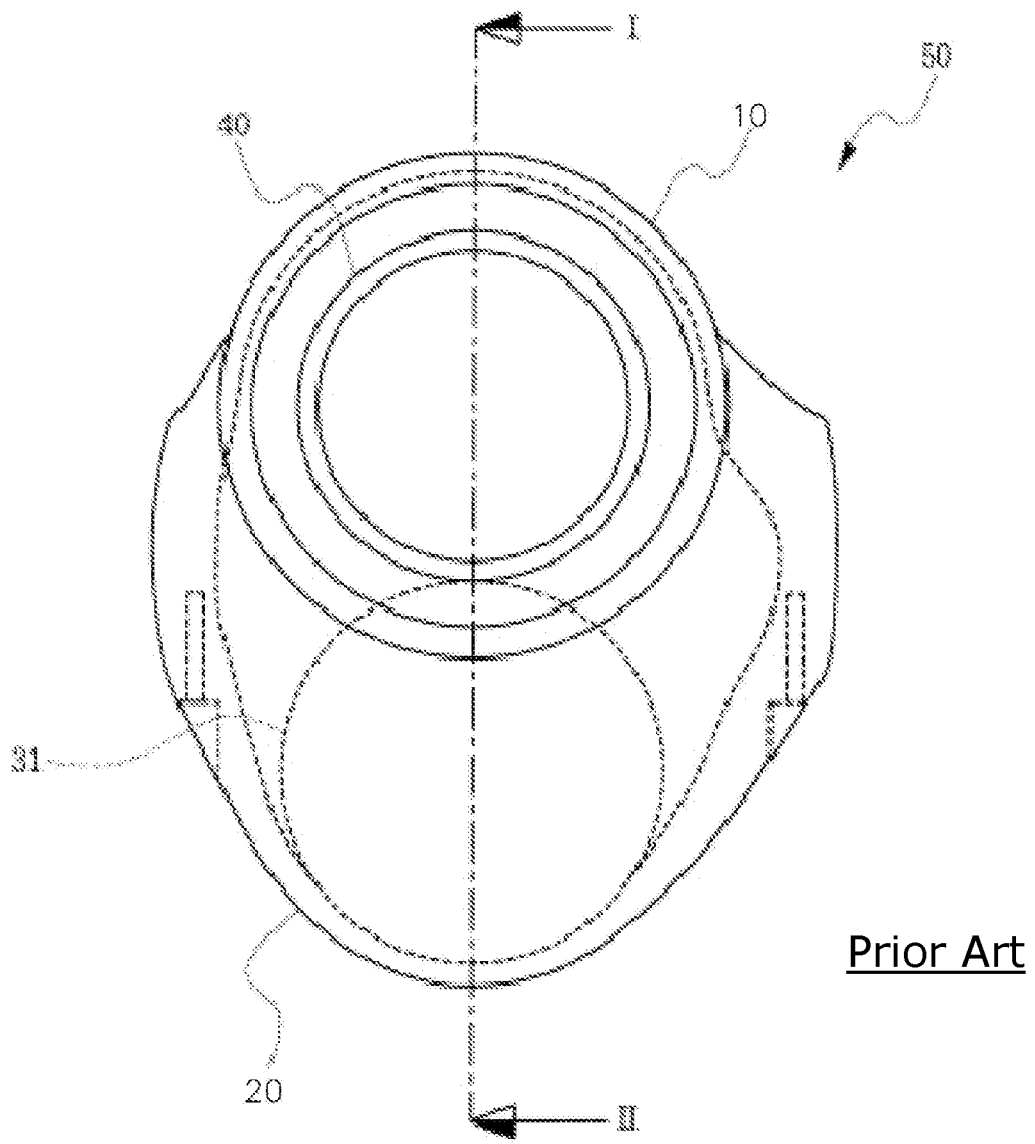
FIG. 1 is a plan view showing a conventional pendulum valve.
Figure 2:
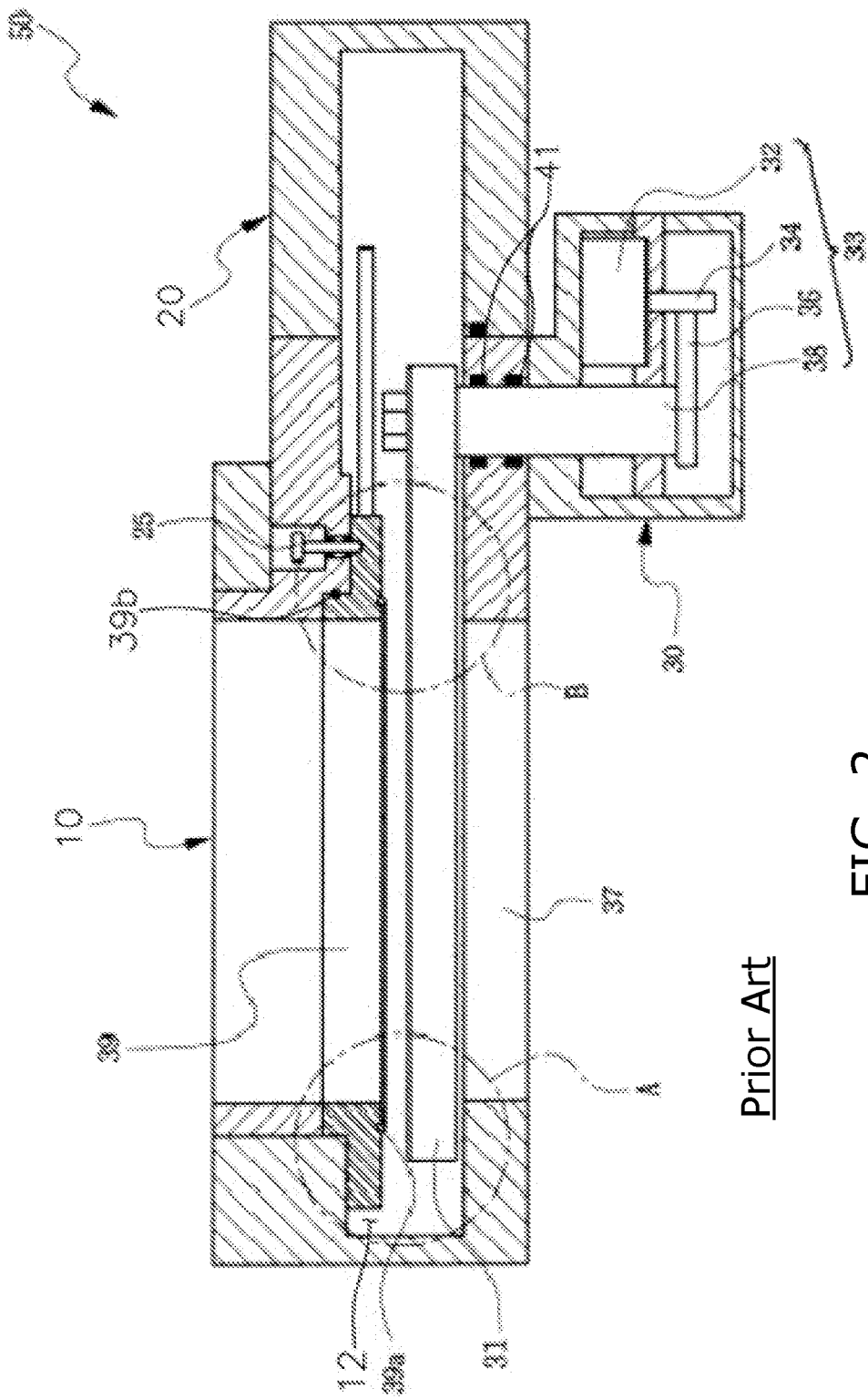
FIG. 2 is a sectional view of the conventional pendulum valve shown in FIG. 1.
Figure 3:
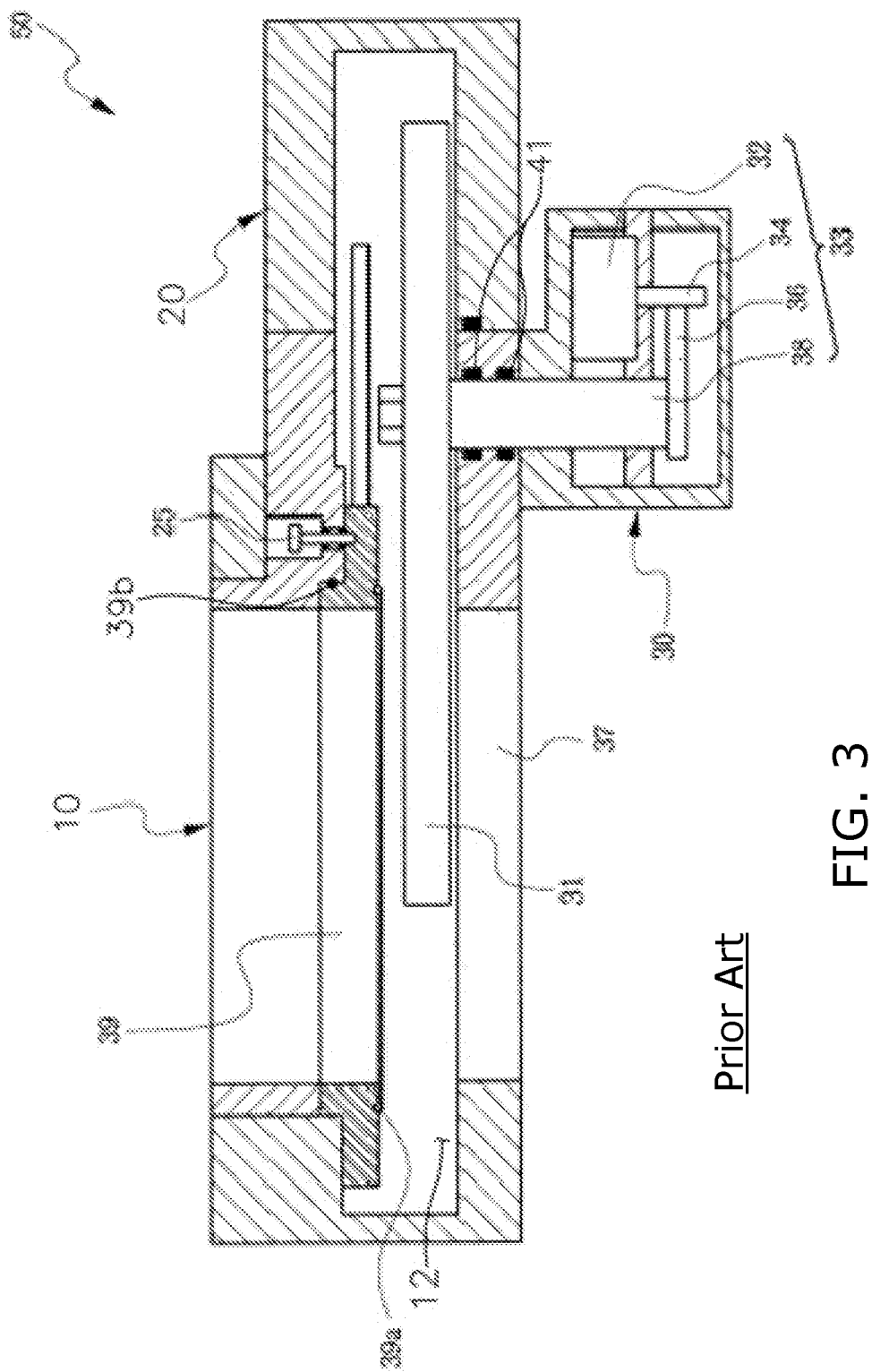
FIGS. 3 and 4 are sectional views illustrating the operating characteristics of the conventional pendulum valve.
Figure 4:
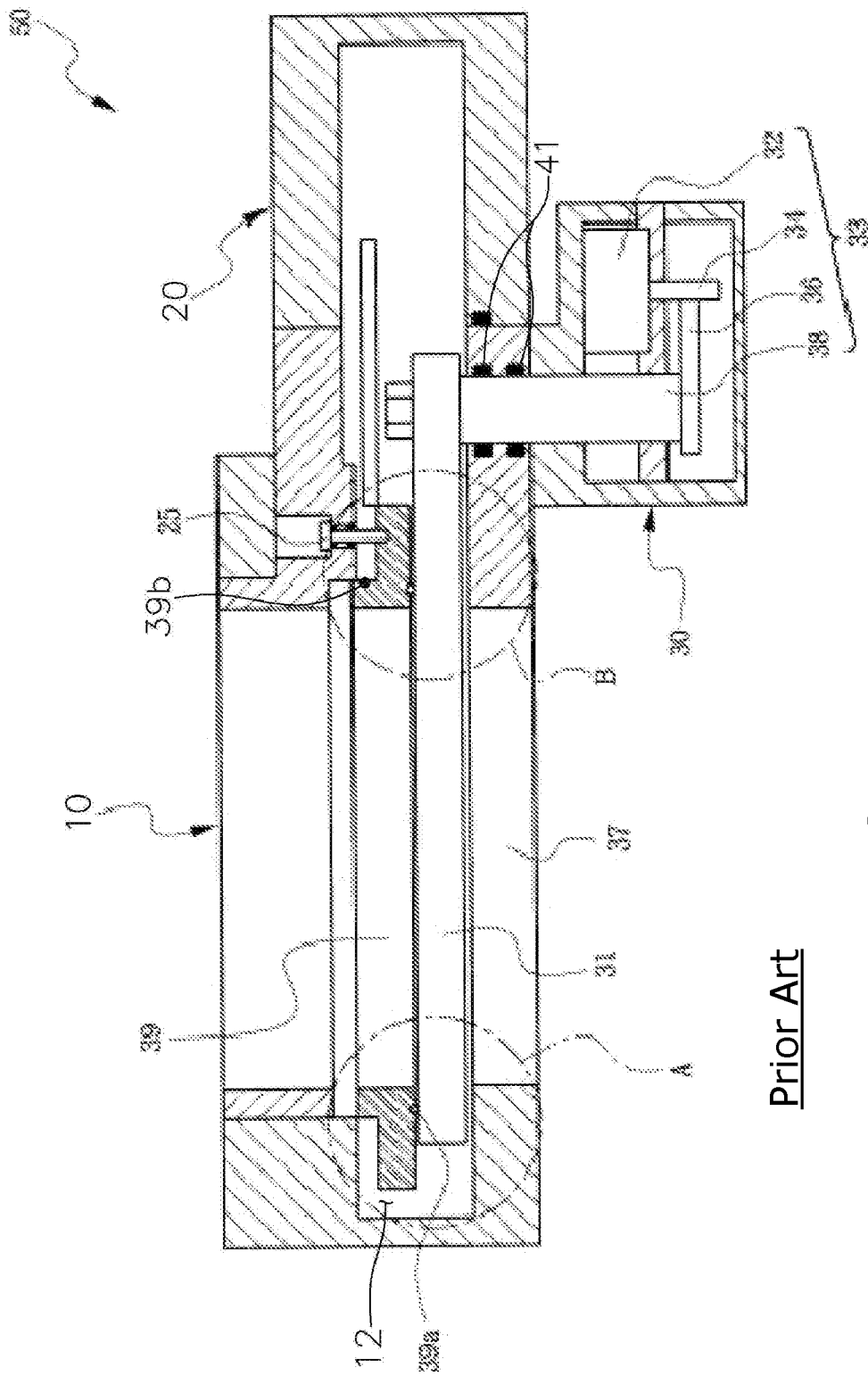

The advantages and features of the present invention and methods of achieving them will become apparent with reference to the embodiments to be described later in detail in conjunction with the accompanying drawings. However, the present invention is not limited to the embodiments disclosed below, but will be implemented in a variety of different forms.

In the present specification, the following embodiments are provided to complete the disclosure of the present invention, and to fully convey the scope of the present invention to those of ordinary skill in the art to which the present invention pertains. Furthermore, the invention is only defined by the scope of the claims. Accordingly, in some embodiments, well-known components, well-known operations, and well-known techniques have not been described in detail in order to avoid the obscuring interpretation of the present invention.

Furthermore, the same reference numerals refer to the same components throughout the specification. In addition, the terms used (referred to) in the present specification are intended to illustrate a corresponding embodiment and are not intended to limit the present invention. In the present specification, a singular form also includes a plural form unless specifically stated in the phrase. In addition, the term "including (or having)" does not exclude the presence or addition of one or more other elements and operations.

Unless otherwise defined, all the terms (including technical and scientific terms) used in the present specification may be used in the senses that can be commonly understood by those of ordinary skill in the art to which the present invention pertains. In addition, the terms that are defined in commonly used dictionaries are not interpreted ideally or excessively unless defined to the contrary.

The technical features of the present invention will be described in detail below with reference to the accompanying drawings. In this case, since the present embodiment is based on the pendulum valve described with reference to FIGS. 1 to 4, descriptions of the overlapping configurations will be replaced with the above corresponding descriptions, and only the configuration of a shaft, which is a technical feature of the present invention, will be described in detail below.

Figure 5:
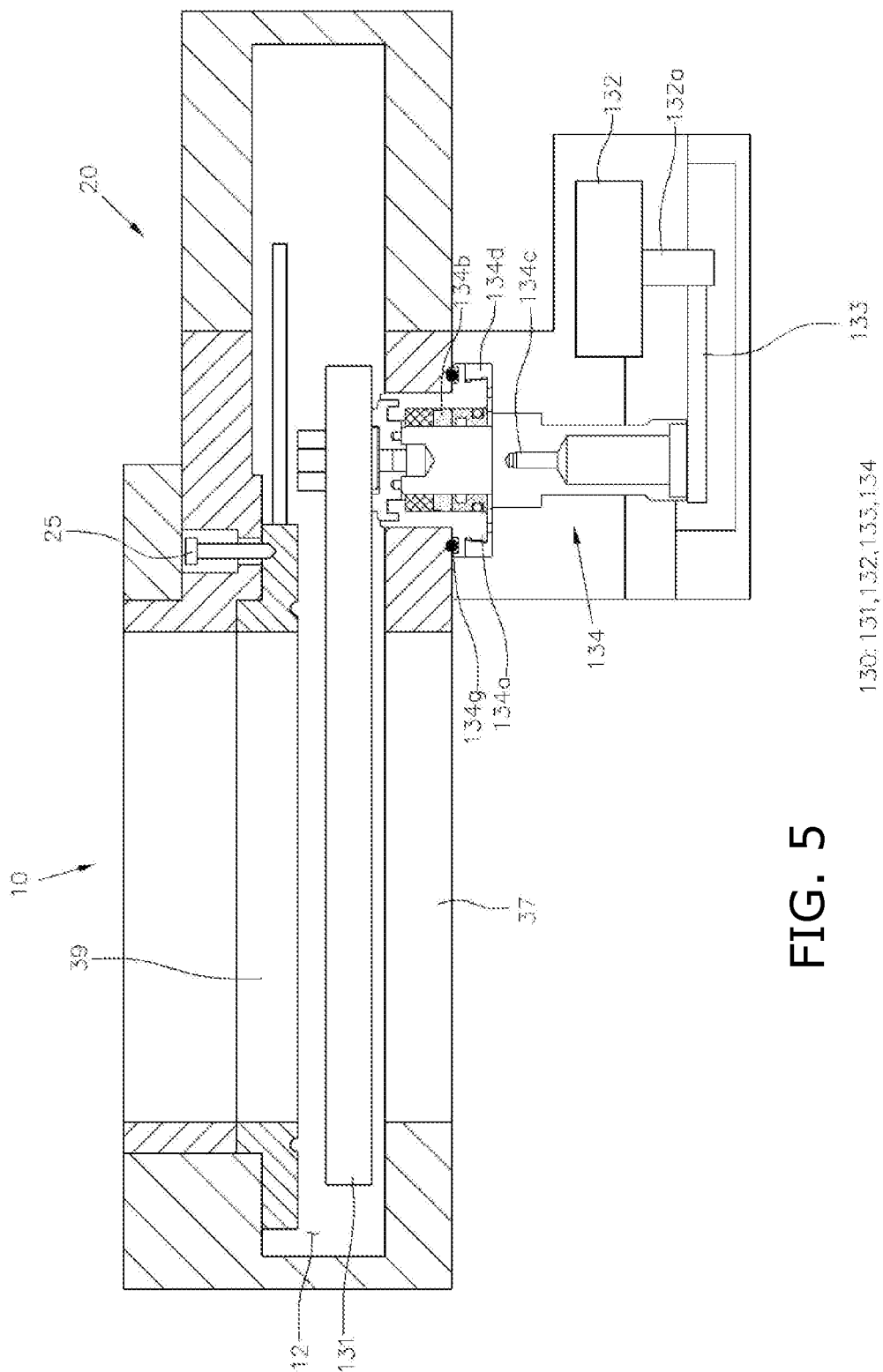
FIG. 5 is a sectional view showing a pendulum valve according to an embodiment of the present invention.

FIG. 5 is a sectional view showing a pendulum valve according to an embodiment of the present invention.

Referring to FIG. 5, a pendulum valve according to an embodiment of the present invention includes a valve housing 10, a cover 20, and an opening/closing part 130. In this case, the valve housing 10 and the cover 20 are the same as those of the pendulum valve 50 shown in FIGS. 1 to 4, but the opening/closing part 130 has a difference in configuration.

The opening/closing part 130 includes a disk-shaped valve gate 131 and a driving part configured to selectively open and close a connection pipe 40 by rotating the valve gate 131. The driving part includes a motor 132 configured to generate a driving force, a gearbox 133 coupled to one end of the shaft 132a of a motor 132 and configured to transmit the driving force of the motor 132, and a shaft 134 coupled to one end of the valve gate 131 and configured to selectively open and close the connection pipe 40 by rotating the valve gate 131 with the rotational force transmitted from the gearbox 133. In this case, the gearbox 133 may include a pinion gear and a reduction gear.

As shown in FIG. 5, the motor 132 is independently installed below the valve housing 10, and the shaft 134 is installed to penetrate through the bottom of the valve housing 10 and protrude into the inside of an operating chamber 12.

In addition, the shaft 134 receives the driving force of the motor 132 via the gearbox 133, rotates, and rotates the valve gate 131. Accordingly, an air passage 37 is selectively opened and closed.

Figure 6:
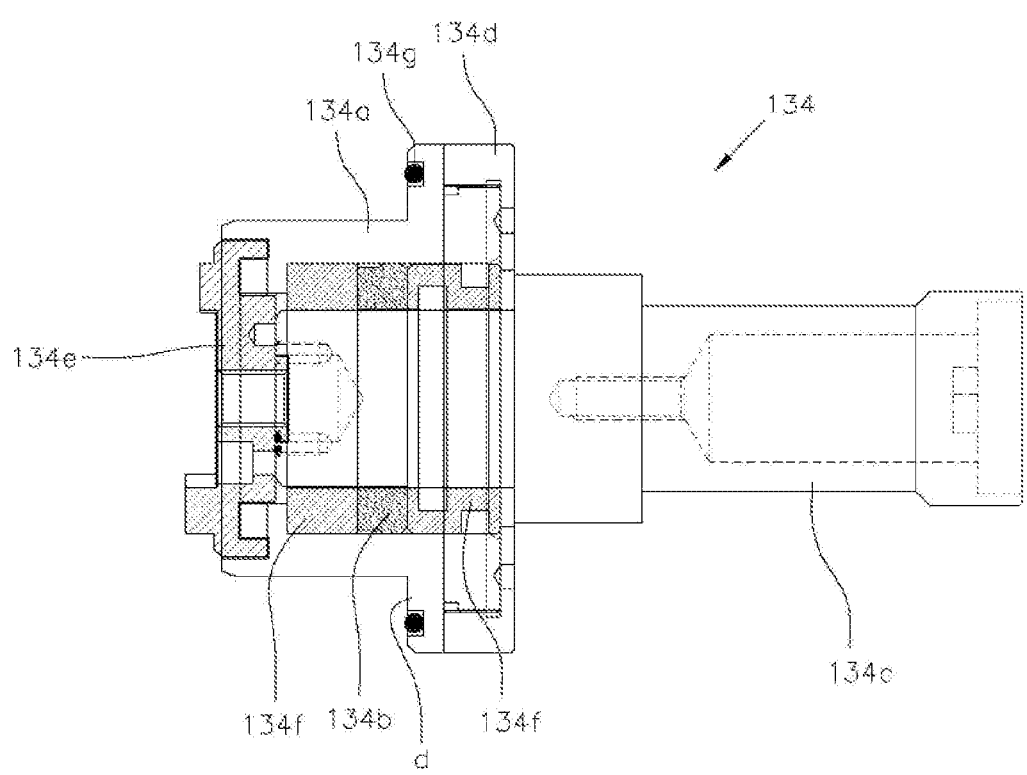
FIG. 6 is a sectional view illustrating a shaft according to the present invention.

FIG. 6 is a sectional view illustrating a shaft according to the present invention.

Referring to FIGS. 5 and 6, the shaft 134 according to the present invention is rotated by the driving force of the motor 132, and includes a fixed housing 134a configured to penetrate and be fixedly coupled through the bottom of the valve housing 10 and a lip seal 134b provided inside the fixed housing 134a.

A rotation shaft 134c is coupled to the inside of the lip seal 134b in order to penetrate through the center of the lip seal 134b. In addition, the rotation shaft 134c is coupled such that one end thereof is coupled to the gearbox 133 and the other end thereof is coupled to one end of the valve gate 131, and is thus rotated by the driving force transmitted through the gearbox 133 by using the lip seal 134b as a rotation axis, thereby rotating the valve gate 131 coupled to the upper end of thereof.

As shown in FIG. 6, in order to seal both sides of the fixed housing 134a, a first cap 134d through which one end of the rotation shaft 134c is coupled is screwed to one side of the fixed housing 134a, and a second cap 134e through which the other end of the rotation shaft 134c is coupled is screwed to the other side of the fixed housing 134a.

Furthermore, bushings 134f may be installed on both sides of the lip seal 134b inside the fixed housing 134a. These bushings 134f fix the lip seal 134b so that the lip seal 134b is not separated from the inside of the fixed housing 134a to the outside, and seal the inside of the lip seal 134b.

An O-ring 134g is installed in a stepped portion d of the fixed housing 134a for the purpose of vacuum sealing.

The operating characteristics of the pendulum valve according to the embodiment of the present invention having the above-described configuration will now be described.

Figure 7:
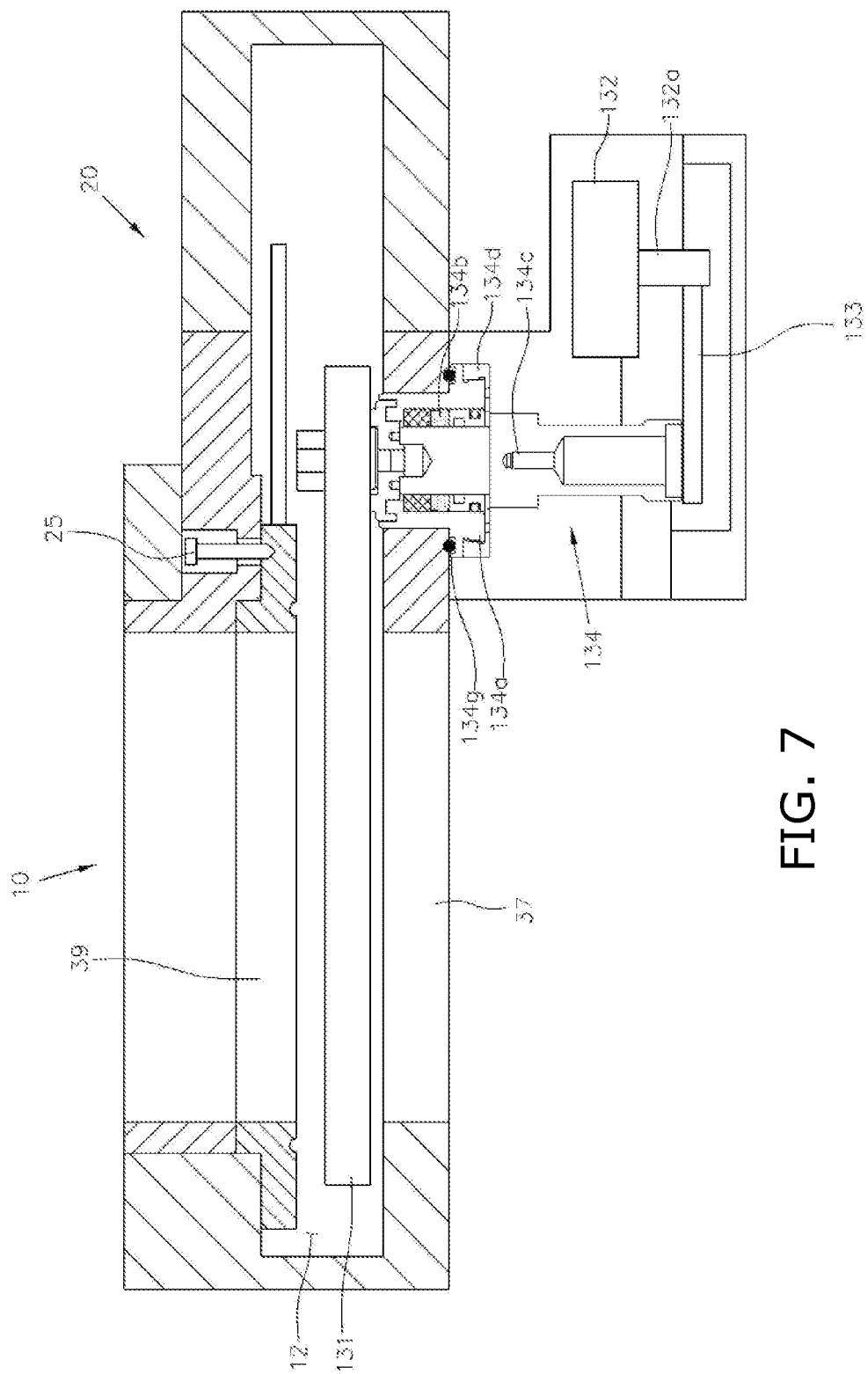
FIGS. 7 and 8 are sectional views illustrating the operating characteristics of the pendulum valve according to the embodiment of the present invention.
Figure 8:
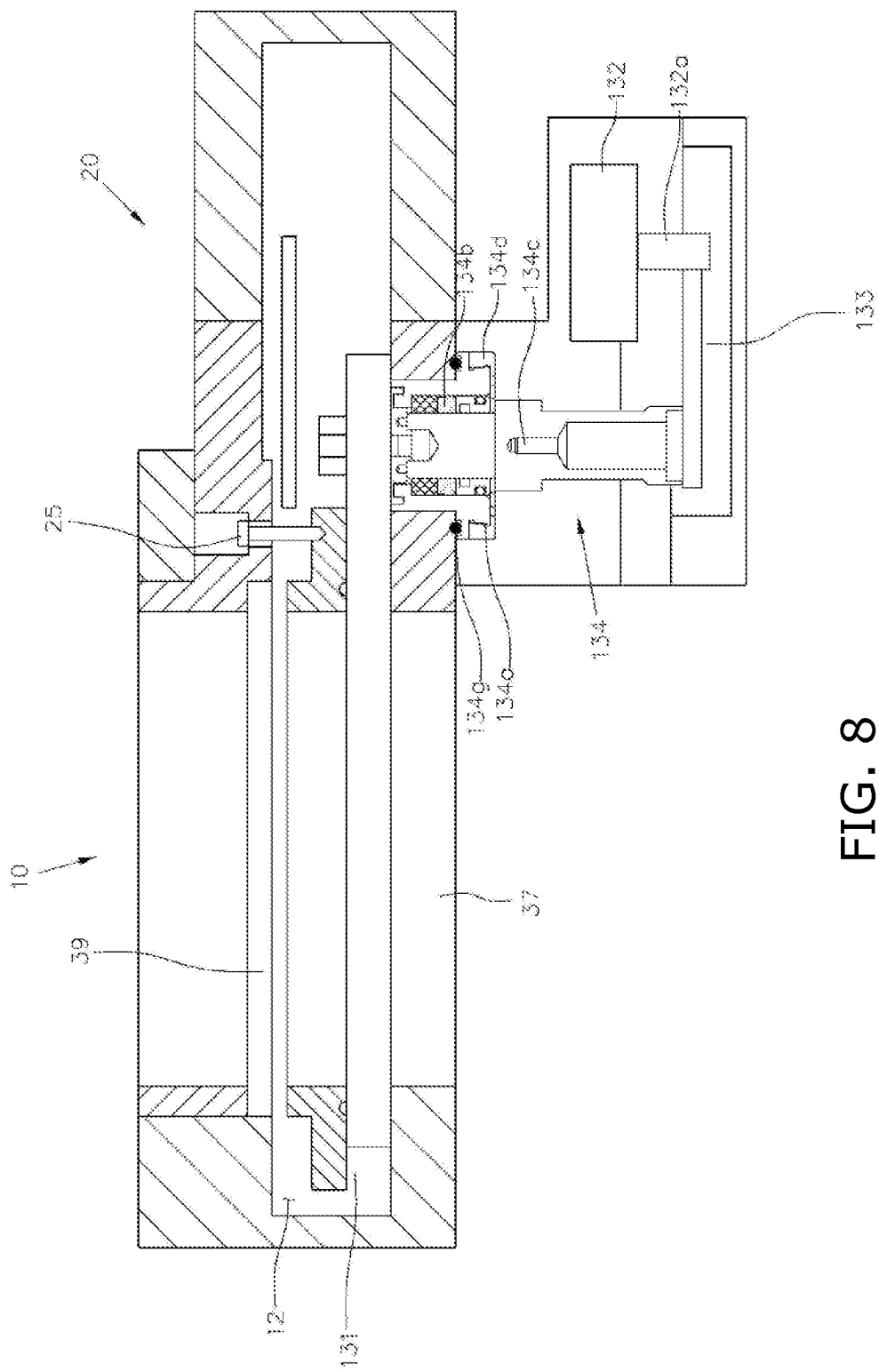

FIGS. 7 and 8 are sectional views illustrating the operating characteristics of the pendulum valve according to the embodiment of the present invention. FIG. 7 shows a state in which the connection pipe is open, and FIG. 8 shows a state in which the connection pipe is closed.

A process of opening the connection pipe will be described with reference to FIG. 7.

As shown in FIG. 7, when the shaft 132a of the motor 132 is rotated in one direction by driving the motor 132, the rotational force of the motor 132 is transmitted to the shaft 134 through the gearbox 133. Thereafter, the rotation shaft 134c of the shaft 134 receives the driving power of the motor 132 through the gearbox 133, and rotates using the lip seal 134b as a rotation axis inside the lip seal 134b. Accordingly, the valve gate 131 coupled to the rotation shaft 134c is rotated to open the air passage 37 formed in the valve housing 10, thereby allowing air to enter and exit. In this case, the sealing element 39 is moved upward by the air cylinder 25 and is thus spaced apart from the valve gate 31.

A process of closing the connection pipe will be described with reference to FIG. 8.

As shown in FIG. 8, when the motor 132 is rotated in the opposite direction, rotational force is transmitted to the shaft 134 through the gearbox 133. In this case, as the rotation shaft 134c of the shaft 134 is rotated in a direction opposite to the rotation direction of FIG. 7 (when the connection pipe is opened), the valve gate 131 is rotated in the opposite direction to seal the air passage 37 of the valve housing 10, and the seal hole 39 is lowered to the air passage 37 by the air cylinder 25 and seals the air passage 37 more tightly.

As described above, according to the present invention, there is provided the pendulum valve that includes the fixed housing configured such that the shaft coupled to the valve gate for adjusting the amount of gas is closely fixed to the valve housing through the O-ring and the rotation shaft (the internal shaft) coupled to the inside of the fixed housing, so that only the rotation shaft separate from the value housing is rotated by using the lip seal as a rotation axis, thereby suppressing the discharge of unnecessary particles and hardened substances while maintaining the sealing characteristics of the pendulum valve.

As described above, the technical spirit of the present invention has been specifically described in conjunction with the exemplary embodiments, but these exemplary embodiments described above are intended to be illustrative, but are not intended to be limitative. As such, it will be understood by those of ordinary skill in the art to which the present invention pertains that various embodiments may be possible through combinations of the embodiments of the present invention within the scope of the technical spirit of the present invention.

What is claimed is:

1. A pendulum valve for semiconductor device manufacturing equipment installed between a process chamber and a vacuum pump, the pendulum valve comprising:
a valve housing configured such that an air passage penetrates therethrough in order to communicate with the process chamber and the vacuum pump and an operation chamber is formed to communicate with the air passage;
a valve gate installed inside the valve housing, and configured to selectively open and close the air passage through pendulum movement;
a shaft assembly connected to one end of the valve gate, and configured to rotate the valve gate;
a motor configured to rotate the shaft assembly; and a gearbox configured to transmit a driving force of the motor to the shaft assembly, wherein the shaft assembly comprises:

a fixed housing configured to penetrate and be fixedly coupled through a bottom of the valve housing;

a lip seal provided inside the fixed housing;

a rotation shaft configured to penetrate through a center of the lip seal such that one end thereof is coupled to the gearbox and a remaining end thereof is coupled to one end of the valve gate, and configured to be rotated by a driving force transmitted through the gearbox by using the lip seal as a rotation axis, thereby rotating the valve gate; and first and second caps respectively coupled to both sides of the fixed housing so that the ends of the rotation shaft penetrate and are coupled through the first and second caps.

2. A pendulum valve for semiconductor device manufacturing equipment installed between a process chamber and a vacuum pump, the pendulum valve comprising:

a valve housing configured such that an air passage penetrates therethrough in order to communicate with the process chamber and the vacuum pump and an operation chamber is formed to communicate with the air passage;

a valve gate installed inside the valve housing, and configured to selectively open and close the air passage through pendulum movement;

a shaft assembly connected to one end of the valve gate, and configured to rotate the valve gate;

a motor configured to rotate the shaft assembly; and a gearbox configured to transmit a driving force of the motor to the shaft assembly, wherein the shaft assembly comprises:

a fixed housing configured to penetrate and be fixedly coupled through a bottom of the valve housing;

a lip seal provided inside the fixed housing;

a rotation shaft configured to penetrate through a center of the lip seal such that one end thereof is coupled to the gearbox and a remaining end thereof is coupled to one end of the valve gate, and configured to be rotated by a driving force transmitted through the gearbox by using the lip seal as a rotation axis, thereby rotating the valve gate; and bushings installed in the fixed housing on both sides of the lip seal so that the lip seal is not separated from the fixed housing.

3. The pendulum valve of claim 1, wherein an O-ring is installed in a stepped portion of the fixed housing in close contact with a bottom of the valve housing for vacuum sealing.

* * * * *